(12) United States Patent
Gupta et al.

(10) Patent No.: US 11,954,907 B2
(45) Date of Patent: Apr. 9, 2024

(54) ELECTRICAL POWER GRID MODELING

(71) Applicant: X Development LLC, Mountain View, CA (US)

(72) Inventors: Ananya Gupta, San Francisco, CA (US); Phillip Ellsworth Stahlfeld, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 282 days.

(21) Appl. No.: 17/356,933

(22) Filed: Jun. 24, 2021

(65) Prior Publication Data

US 2021/0406537 A1 Dec. 30, 2021

Related U.S. Application Data

(60) Provisional application No. 63/044,781, filed on Jun. 26, 2020.

(51) Int. Cl.
*G06V 20/10* (2022.01)
*G06F 16/29* (2019.01)
(Continued)

(52) U.S. Cl.
CPC ............ *G06V 20/182* (2022.01); *G06F 16/29* (2019.01); *G06F 16/587* (2019.01);
(Continued)

(58) Field of Classification Search
CPC .. G06V 20/182; G06V 20/176; G06V 20/194; G06F 16/29; G06F 16/587;
(Continued)

(56) References Cited

U.S. PATENT DOCUMENTS 7,046,841 B1 * 5/2006 Dow ..................... G06V 20/64
382/154
7,860,702 B1 12/2010 Evans et al.
(Continued)

FOREIGN PATENT DOCUMENTS

CN 102508110 B * 7/2014 ............. G01R 31/08
CN 106980827 7/2017
(Continued)

OTHER PUBLICATIONS

Sohn, G., Jwa, Y. and Kim, H.B., 2012. Automatic powerline scene classification and reconstruction using airborne lidar data. ISPRS Ann. Photogramm. Remote Sens. Spat. Inf. Sci, 13(167172), p. 28.*
(Continued)

*Primary Examiner* — Zhitong Chen
(74) *Attorney, Agent, or Firm* — Fish & Richardson P.C.

(57) ABSTRACT

Methods, systems, and apparatus, including computer programs encoded on a storage device, for electric grid modeling using surfel data are enclosed. An electric grid wire identification method includes: obtaining a set of surface elements (surfels), wherein each surfel of the set of surfels represents a portion of a surface of an object in a geographic region; selecting, based on one or more surfel attributes, one or more surfels of the set of surfels that each represent a portion of a surface of an electric grid wire; generating a representation of the electric grid wire from the selected one or more surfels; and adding the representation of the electric grid wire to a virtual model of the electric grid. Obtaining the set of surfels can include obtaining ranging data of the geographic region; and generating the set of surfels from the ranging data.

20 Claims, 8 Drawing Sheets

(51) Int. Cl.

| | |
|---|---|
| *G06F 16/587* | (2019.01) |
| *G06F 18/2413* | (2023.01) |
| *G06F 30/18* | (2020.01) |
| *G06T 5/30* | (2006.01) |
| *G06T 7/50* | (2017.01) |
| *G06T 7/60* | (2017.01) |
| *G06T 7/73* | (2017.01) |
| *G06T 11/20* | (2006.01) |
| *G06T 17/05* | (2011.01) |
| *H02J 3/00* | (2006.01) |

(52) U.S. Cl.
CPC ........ *G06F 18/24133* (2023.01); *G06F 30/18* (2020.01); *G06T 5/30* (2013.01); *G06T 7/50* (2017.01); *G06T 7/60* (2013.01); *G06T 7/73* (2017.01); *G06T 7/75* (2017.01); *G06T 11/206* (2013.01); *G06T 17/05* (2013.01); *G06V 20/176* (2022.01); *H02J 3/00* (2013.01); *G06T 2207/10032* (2013.01); *G06T 2207/30184* (2013.01); *G06V 20/194* (2022.01); *H02J 2203/20* (2020.01)

(58) Field of Classification Search
CPC ..... G06F 18/24133; G06F 30/18; G06T 5/30; G06T 7/50; G06T 7/60; G06T 7/73; G06T 7/75; G06T 11/206; G06T 17/05; G06T 2207/10032; G06T 2207/30184; G06T 2207/10016; G06T 2207/10028; G06T 7/181; G06T 2207/10024; G06T 7/12; G06T 2207/10048; H02J 3/00; H02J 2203/20; H02J 13/00001; G06Q 10/04; G06Q 50/06; G01S 17/89; Y04S 10/40

See application file for complete search history.

(56) References Cited

U.S. PATENT DOCUMENTS

| | | | |
|---|---|---|---|
| 8,340,360 B2 | 12/2012 | Chen et al. | |
| 9,262,852 B1 | 2/2016 | Kehl et al. | |
| 10,444,806 B2 | 10/2019 | Brockman et al. | |
| 2006/0262876 A1 | 11/2006 | Ladue et al. | |
| 2010/0198775 A1 | 8/2010 | Roussselle et al. | |
| 2012/0027298 A1 | 2/2012 | Dow et al. | |
| 2012/0089384 A1 | 4/2012 | Coyne et al. | |
| 2013/0066600 A1 | 3/2013 | Roussselle et al. | |
| 2013/0166270 A1 | 6/2013 | Sun et al. | |
| 2016/0343093 A1 | 11/2016 | Riland et al. | |
| 2017/0092055 A1 | 3/2017 | Brockman et al. | |
| 2018/0330242 A1 | 11/2018 | Dubios et al. | |
| 2019/0130182 A1 | 5/2019 | Li et al. | |
| 2020/0034638 A1 | 1/2020 | Brewington et al. | |
| 2020/0043285 A1 | 2/2020 | Brockman et al. | |
| 2021/0407187 A1 | 12/2021 | Gupta et al. | |
| 2023/0186621 A1 | 6/2023 | Gupta et al. | |

FOREIGN PATENT DOCUMENTS

| | | |
|---|---|---|
| WO | WO/2006/026446 | 3/2006 |
| WO | WO/2017/100916 | 6/2017 |
| WO | WO/2019/053588 | 3/2019 |

OTHER PUBLICATIONS

Invitation to Pay Additional Fees in International Appln. No. PCT/US2021/038939, dated Oct. 15, 2021, 10 pages.
Github.com [online], "How to Replicate FB's distribution grid prediction model," Jan. 24, 2019, retrieved from URL<https://github.com/facebookresearch/many-to-many-dijkstra/blob/master/Model%20Tu torial%20-%20PDF.pdf/>, 35 pages.
International Search Report and Written Opinion in International Appln. No. PCT/US2021 /038939, dated Feb. 7, 2022, 22 pages.
Bing.com [online], "How to replicate FBs distribution grid prediction model," Jan. 24, 2019, retrieved on Jun. 29, 2023, retrieved from URL<https://www.bing.com/search?pglt=675&q=How+to+replicate+FBs+distribution+grid+prediction+model&cvid=39535d68b3f741d682cf9eefce8b45ff&aqs-edge..69i57j69i60j69i11004.213j0j1&FORM=ANNABI&PC=U531/>, 35 pages.
Extended Search Report in European Appln. No. 23165714.9, dated Jun. 14, 2023, 8 pages.
International Preliminary Report on Patentability in International Appln. No. PCT/US2021/038939, dated Jan. 5, 2023, 13 pages.

* cited by examiner

ELECTRICAL POWER GRID MODELING

CROSS-REFERENCE TO RELATED APPLICATION

This application claims the benefit of U.S. Application No. 63/044,781, filed Jun. 26, 2020, which is incorporated by reference in its entirety.

TECHNICAL FIELD

The present specification relates to electrical power grids, and specifically to generating models of electrical power grids.

BACKGROUND

Electrical power grids transmit electrical power to loads such as residential and commercial buildings. Various electrical power grid conditions can be simulated and visualized using electrical power grid models. Electric grid models are used to evaluate and predict operations and potential faults in an electric grid. However, present approaches for modeling electric grids generate inaccurate predictions of the locations of important electric grid assets such as transformers, capacitors, and electric grid wires, or power lines, that are commonly attached to utility poles. Due to the growing size, complexity, and variability of electrical power grids, there is a need for an ability to model, simulate, and monitor electrical power grid conditions dynamically as they change over time.

SUMMARY

In general, the present disclosure relates to a system for accurately modeling electric power grids using surface element (surfel) data. The present disclosure provides a system and method to more accurately detect the locations of various assets within an electric power grid and to determine the overall structure of the electric power grid.

In some implementations, a system can use surfel data to identify electric grid wires, e.g., power lines, of an electrical power distribution system. Surfel data can be generated by sub sampling ranging data such as light detection and ranging (LIDAR) data. The system can use ranging data of a region near a location of a utility pole. In some examples, the system can use ranging data of a region near estimated locations of power lines.

In some examples, the system can obtain surfel data by converting the ranging data into a set of surfels. For example, the system can convert a LIDAR image to a surfel image. Surfels are local geometrical approximations of underlying three-dimensional surfaces. Surfels are often represented in surfel images as ellipsoids. Because surfels represent three-dimensional surfaces, surfel data can be used to distinguish between objects that would be occluded in a two-dimensional image. For example, surfel data can be used to disambiguate between grid wires that overlap from an overhead perspective, since the lines might not be occluded from a street view perspective. The surfels approximate the shapes of various objects located within the region near the utility pole. The system classifies attributes and characteristics of the surfels. For example, the system can classify the general shape (e.g., tubular or round) and orientation of each surfel (e.g., vertical or horizontal). The system can identify individual wires extending from the utility pole based on the characteristics of the surfel. In some cases the system can identify individual wires extending from the utility pole based on the characteristics of LIDAR data, instead of or in addition to the surfel data. The system can correlate the individual wires to either known power lines (e.g., from the graph based representation of the power lines) or identify the wires as likely grid wires (e.g., based on a non-correlation). The system can then add representations of the detected grid wires to a model of the electric grid.

An asset detection system can employ a combination of overhead and street level imagery to detect the location of electric grid assets located on or near utility poles. The system can locate and identify power wires within overhead imagery using a semantic segmentation model. Once located, a polyline graph of the wires can be generated by applying image processing techniques to the overhead imagery. For example, the image processing techniques can include morphological thinning and segmentation rastering techniques.

The polylines are exploded by replacing curved sections with a series of fixed lines and endpoints that approximate the curve. Gaps in the polyline graph, e.g., where power lines were masked by trees or other structures, can be completed by estimating line locations. The graph of fixed lines, endpoints, and estimated lines form a graph based representation of the power lines.

The asset detection system used the graph based representation to identify the locations of utility poles. For example, the system can estimate utility pole locations based on characteristics of the fixed lines and endpoints. Such characteristics that are indicative of a utility pole include, but are not limited to, endpoints that terminate a length of wire, a junction between two or more lines, an angle greater than a threshold value between two lines meeting at an endpoint, at estimated distances along an extended length line from a known pole location.

The system then uses the estimated pole locations to identify appropriate street level imagery for inspection. For example, the system can correlate the estimated pole locations from the graph based representation of the power lines to a database of street level imagery. The system can select street level images of a region near the estimated pole locations. By applying object detection algorithms to the selected street level images, the system can identify or detect the existence of various electric grid assets (e.g., transformers and capacitors) that may be located on or near the pole. The system can then add representations of the detected grid assets to a model of the electric grid.

In general, innovative aspects of the subject matter described in this specification can be embodied in an electric grid asset detection method including: obtaining overhead imagery of a geographic region that includes electric grid wires; identifying the electric grid wires within the overhead imagery; generating a polyline graph of the identified electric grid wires; replacing curves in polylines within the polyline graph with a series of fixed lines and endpoints; identifying, based on characteristics of the fixed lines and endpoints, a location of a utility pole that supports the electric grid wires; detecting an electric grid asset from street level imagery at the location of the utility pole; and generating a representation of the electric grid asset for use in a model of the electric grid.

In some implementations, the overhead imagery includes at least one of visible light imagery, infrared imagery, hyperspectral imagery, multispectral imagery, RADAR imagery, or LIDAR imagery.

In some implementations, generating the polyline graph of the identified electric grid wires includes: generating, from the overhead imagery, a segmented raster including a preliminary polygon encompassing electric grid wires; and performing a thinning process on the preliminary polygon to generate the polyline graph.

In some implementations, replacing a curve in a polyline with a series of fixed lines and endpoints includes: identifying a curve in the polyline as viewed from an overhead perspective; determining a change angle between a direction of the polyline on a first side of the curve and a direction of the polyline on a second side of the curve; determining that the change angle is greater than a threshold angle; and in response to determining that the change angle is greater than the threshold angle, replacing the curve with two or more fixed lines and one or more endpoints.

In some implementations, replacing a curve in the polyline with a series of fixed lines and endpoints includes: identifying a curve in the polyline as viewed from an overhead perspective; determining a change angle between a direction of a first side of the curve and a direction of a second side of the curve; determining that the change angle is less than a threshold angle; and in response to determining that the change angle is less than the threshold angle, replacing the curve with a single fixed line.

In some implementations, identifying a location of a utility pole that supports the electric grid wires includes determining that an endpoint corresponds to the location of a utility pole.

In some implementations, identifying the location of the utility pole that supports the electric grid wires includes: determining that a length of a fixed line exceeds a threshold length; in response to determining that the length of the fixed line exceeds the threshold length, determining that at least one utility pole is located along the fixed line; and identifying the location of the utility pole at a midpoint of the fixed line.

In some implementations, identifying the location of the utility pole that supports the electric grid wires includes: determining that a length of a fixed line exceeds a threshold length; in response to determining that the length of the fixed line exceeds the threshold length, determining that at least one utility pole is located along the fixed line; determining a median distance between utility poles in a geographic region where the electric grid wires are located; and identifying the location of the utility pole along the fixed line, the location being a distance away from another utility pole that is equal to an integer multiple of the median distance.

In some implementations, the method includes: obtaining, based on the location of the utility pole, and from a database of street level imagery, the street level imagery at the location of the utility pole.

In some implementations, the electric grid asset includes one of a capacitor, a transformer, a switch, or a feeder.

In some implementations, the representation of the electric grid asset includes at least one of a geographic location, a height, a classification, or a status of the electric grid asset.

In some implementations, the method further includes: obtaining ranging data at the location of the utility pole; converting the ranging data into a set of surfels; classifying characteristics of surfels within a region surrounding the utility pole; and detecting one or more surfels that represent an electric grid asset based on the characteristics of the surfels.

In another general aspect, an electric grid wire identification method includes: obtaining a set of surface elements surfels, wherein each surfel of the set of surfels represents a portion of a surface of an object in a geographic region; selecting, based on one or more surfel attributes, one or more surfels of the set of surfels that each represent a portion of a surface of an electric grid wire; generating a representation of the electric grid wire from the selected one or more surfels; and adding the representation of the electric grid wire to a virtual model of an electric grid.

In some implementations, obtaining the set of surfels includes obtaining ranging data of the geographic region; and generating the set of surfels from the ranging data.

In some implementations, the method includes selecting the geographic region, the selecting including: determining, based on overhead imagery of the geographic region, that the geographic region likely includes at least one electric grid wire.

In some implementations, the method includes selecting the geographic region, the selecting including: determining, based on overhead imagery of the geographic region, that the geographic region likely includes at least one utility pole or power line.

In some implementations, the ranging data includes at least one of RADAR data or LIDAR data.

In some implementations, selecting the one or more surfels that each represent a portion of a surface of an electric grid wire includes determining, using the set of surfels, a location of a utility pole; and classifying attributes of surfels within a region surrounding the location of the utility pole.

In some implementations, the surfel attributes include at least one of a shape, a location, a height, a texture, a color, a depth, or an orientation of the surfel.

In some implementations, selecting, based on one or more surfel attributes, the one or more surfels that each represent a portion of a surface of an electric grid wire includes determining that the one or more surfels has a shape that satisfies shape criteria for representing an electric grid wire.

In some implementations, determining that the one or more surfels has a shape that satisfies shape criteria for representing an electric grid wire includes classifying the one or more surfels as having a tubular shape.

In some implementations, selecting, based on one or more surfel attributes, the one or more surfels that each represent a portion of a surface of an electric grid wire includes determining that the one or more surfels has an orientation that satisfies orientation criteria for representing an electric grid wire.

In some implementations, determining that the one or more surfels has an orientation that satisfies orientation criteria for representing an electric grid wire includes classifying the one or more surfels as having an orientation that is approximately parallel to a ground surface.

In some implementations, selecting, based on one or more surfel attributes, the one or more surfels that each represent a portion of a surface of an electric grid wire includes determining that the one or more surfels has a height that satisfies height criteria for representing an electric grid wire.

In some implementations, determining that the one or more surfels has a height that satisfies height criteria for representing an electric grid wire includes classifying the one or more surfels as having a height greater than a minimum height above a ground surface.

In some implementations, selecting, based on one or more surfel attributes, one or more surfels that each represent a surface of an electric grid wire includes: processing the set of surfels using a surfel classification model that is configured to identify surfels that represent surfaces of electric grid wires; and obtaining, as output from the surfel classification model, data that identifies the one or more surfels of the set of surfels that each represent a surface of an electric grid wire.

In some implementations, selecting, based on one or more surfel attributes, one or more surfels that each represent a surface of an electric grid wire includes: determining that the one or more surfels each satisfies initial criteria for representing an electric grid wire; the initial criteria including at least one of shape criteria, orientation criteria, or height criteria; and classifying the one or more surfels as being part of a cluster of surfels. Each surfel of the cluster of surfels satisfies the initial criteria.

In some implementations, the cluster of surfels includes two or more surfels that are each located within a threshold distance to at least one other surfel of the cluster.

In some implementations, selecting, based on one or more surfel attributes, one or more surfels that each represent a portion of a surface of an electric grid wire includes: determining, based on overhead imagery of the geographic region, an estimated end point of the electric grid wire; and determining that a location of an end point of the cluster of surfels corresponds to the estimated end point of the electric grid wire.

In some implementations, selecting, based on one or more surfel attributes, one or more surfels that each represent a portion of a surface of an electric grid wire includes: determining, using the set of surfels, an estimated location of a utility pole; and determining that a location of an end point of the cluster of surfels corresponds to the estimated location of the utility pole.

In some implementations, generating a representation of the electric grid wire from the selected one or more surfels includes fitting a geometric curve to the selected one or more surfels. The geometric curve represents a path of the electric grid wire.

In some implementations, the representation of the electric grid wire includes at least one of a geographic location, a size, a height, a classification, or a cardinal orientation of the electric grid wire.

In some implementations, obtaining the set of surfels includes obtaining the set of surfels from a database of surfels. The database of surfels stores surfels generated from ranging data obtained from multiple geographic regions.

Other implementations of the above aspects include corresponding systems, apparatus, and computer programs, configured to perform the actions of the methods, encoded on computer storage devices. The details of one or more implementations of the subject matter described in this specification are set forth in the accompanying drawings and the description below. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

This disclosure generally describes computer-implemented methods, software, and systems for electrical power grid modeling. Specifically, the present disclosure provides a system and method to more accurately detect the locations of various assets within an electric power grid.

Figure 1:
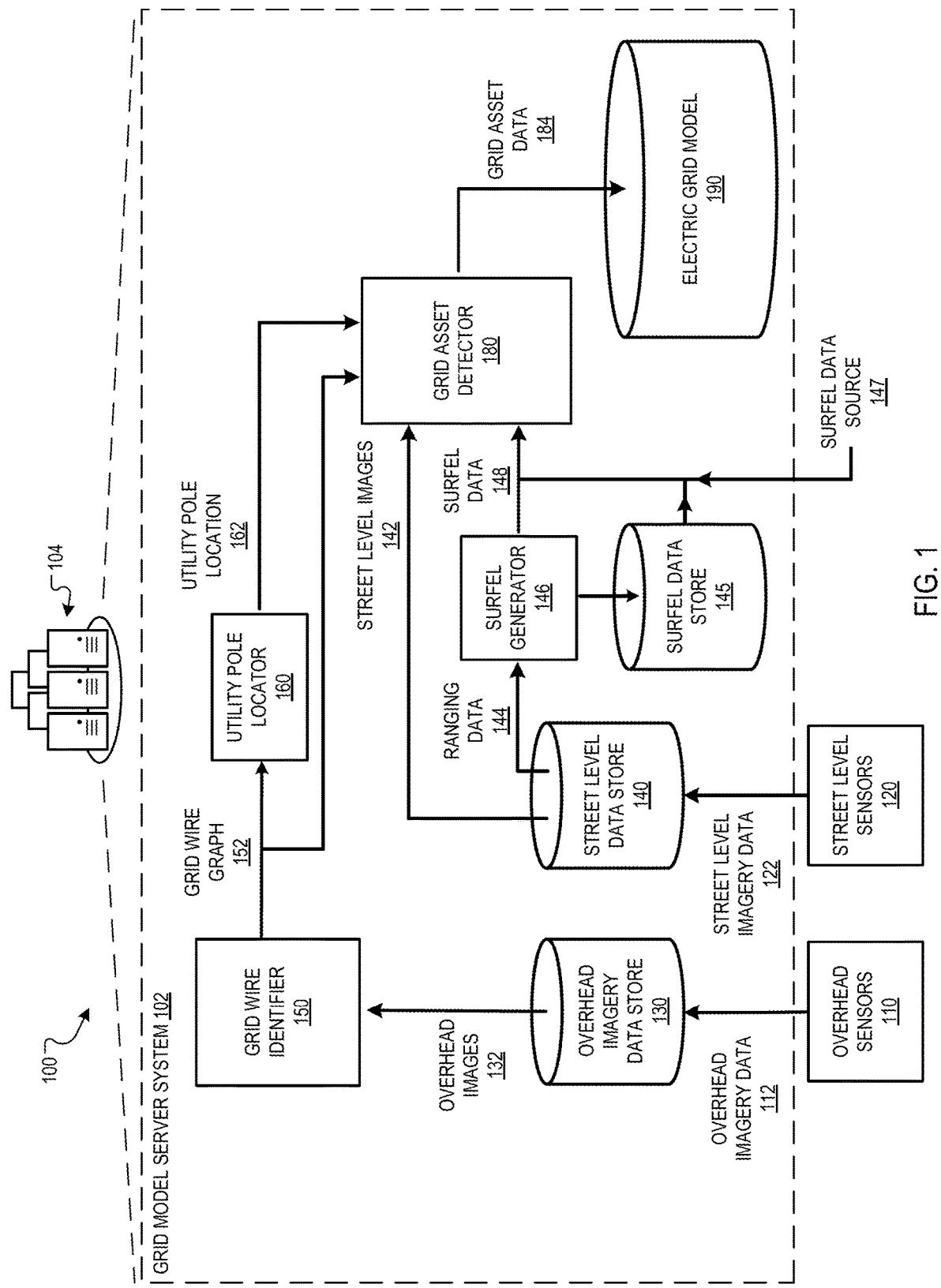
FIG. 1 is a diagram of an example system for electrical power grid modeling.
Figure 4:
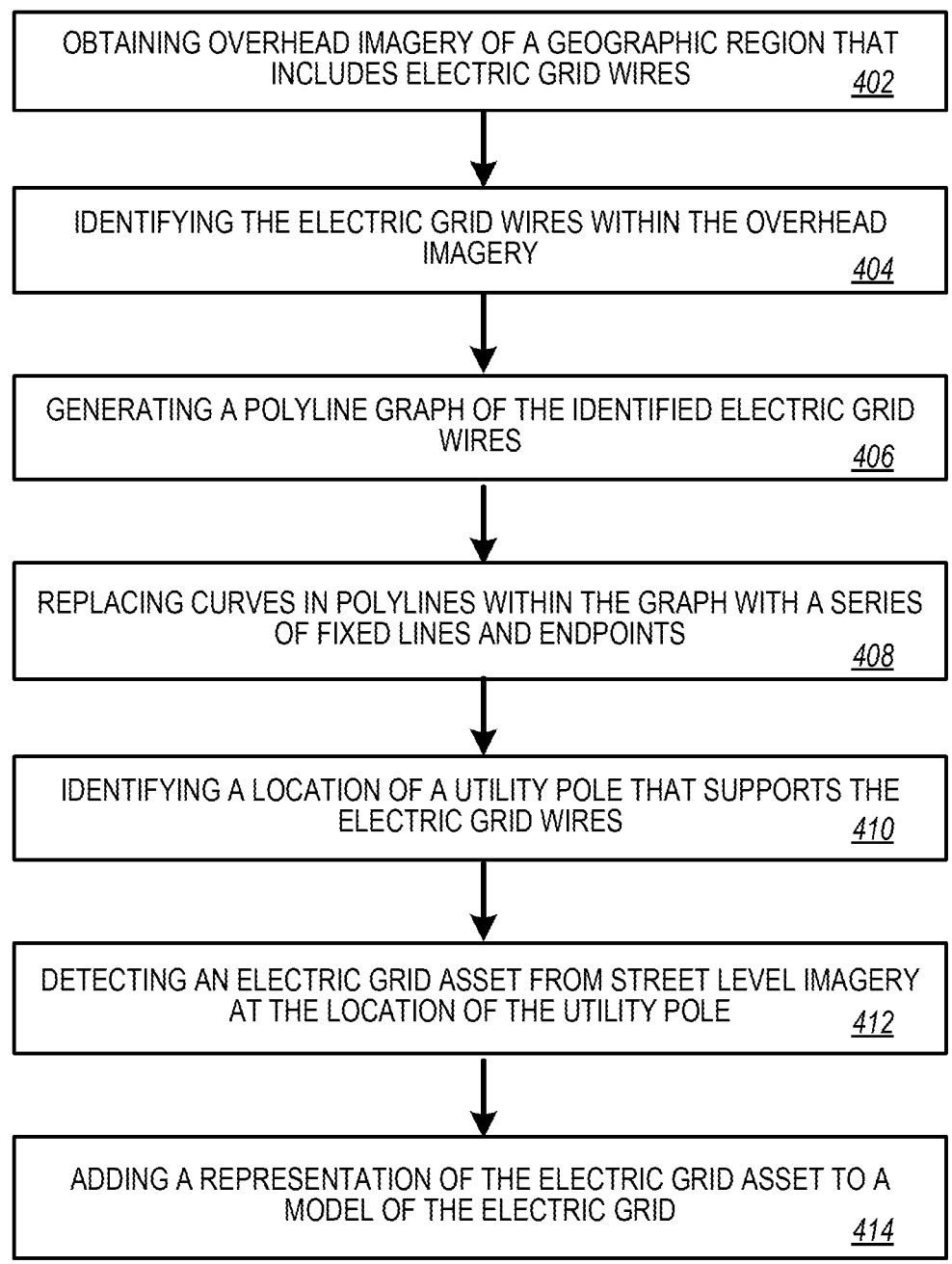
FIG. 4 is a flow diagram of an example process for modeling electrical power grid assets.
Figure 5:
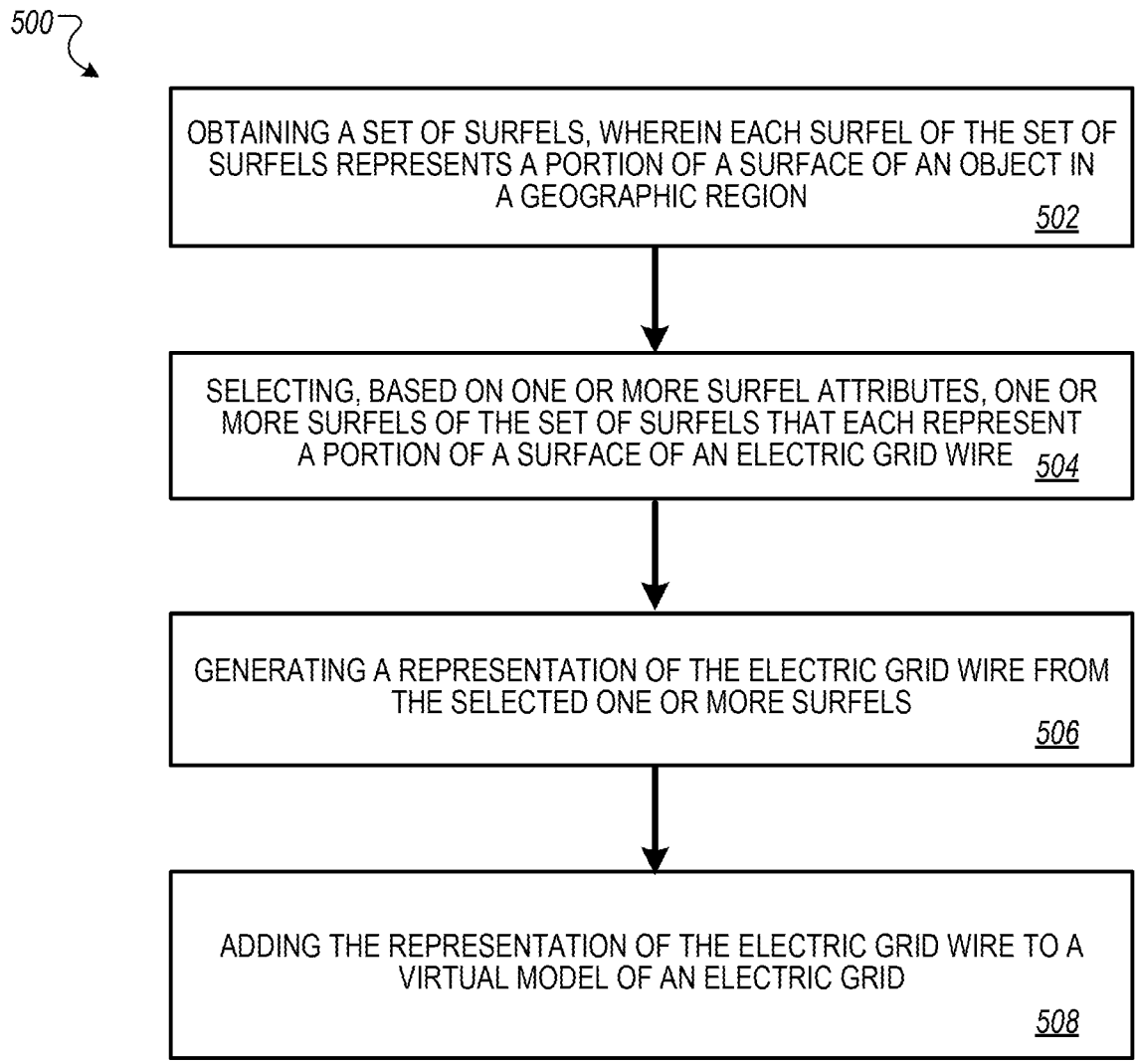
FIG. 5 is a flow diagram of an example process for modeling electrical power grid wires.

FIG. 1 is a diagram of an example system 100 for electrical power grid modeling. The system 100 can be used to perform a process 400 for modeling of electrical power grid assets and a process 500 for modeling electrical power grid wires. A flow diagram of the process 400 is illustrated in FIG. 4. A flow diagram of the process 500 is illustrated in FIG. 5.

The system 100 includes a grid model server system 102. The server system 102 may be hosted within a data center 104, which can be a distributed computing system having hundreds or thousands of computers in one or more locations.

The server system 102 includes an overhead imagery data store 130 and a street level data store 140. The server system 102 also includes a grid wire identifier 150, a utility pole locator 160, a surfel generator 146, and a grid asset detector 180. The grid wire identifier 150, a utility pole locator 160, a surfel generator 146, and a grid asset detector 180 can each be provided as one or more computer executable software modules or hardware modules. That is, some or all of the functions of grid wire identifier 150, utility pole locator 160, surfel generator 146, and grid asset detector 180 can be provided as a block of computer code, which upon execution by a processor, causes the processor to perform functions described below. Some or all of the functions of grid wire identifier 150, utility pole locator 160, surfel generator 146, and grid asset detector 180 can be implemented in electronic circuitry, e.g., by individual computer systems (e.g., servers), processors, microcontrollers, a field programmable gate array (FPGA), or an application specific integrated circuit (ASIC). The server system 102 also includes an electric grid model 190.

The process 400 includes obtaining overhead imagery of a geographic region that includes electric grid wires (402). The server system 102 can receive overhead imagery data 112 from overhead sensors 110. Overhead sensors 110 can include, for example, aerial and satellite sensors. Overhead sensors can include visible light cameras, infrared sensors, RADAR sensors, and LIDAR sensors.

The overhead imagery data 112 can include visible light data, e.g., red-green-blue (RGB) data, collected by the overhead sensors 110. The overhead imagery data 112 can also include hyperspectral data, multispectral data, infrared data, RADAR data, and LIDAR data collected by the overhead sensors.

The overhead imagery data 112 can include two-dimensional (2D) data, 2.5D data, or 3D data. The overhead imagery data 112 can include multiple channels or layers of imagery data. For example, the overhead imagery data 112 can include an RGB layer, a height model layer, a digital surface model layer, and a vegetation index layer.

The overhead imagery data 112 can include data from multiple images collected over time. In some examples, the overhead sensors 110 capture multiple images and generate a combined image from the multiple images.

The overhead imagery data 112 represents features of a geographic region. The geographic region can include, for example, an area of hundreds of square meters, several kilometers, hundreds of kilometers, or thousands of kilometers. The geographic region can correspond to a location of an electrical distribution feeder or multiple feeders. In some cases, the geographic region can correspond to a location of a bulk power system within and throughout, e.g., a state, county, province, or country. The server system 102 can store the overhead imagery data 112 in the overhead imagery data store 130.

The process 400 includes identifying the electric grid wires within the overhead imagery (404). The server system 102 can identify the electric grid wires using the grid wire identifier 150. The grid wire identifier 150 can obtain overhead images 132 from the overhead imagery data store 130.

The grid wire identifier 150 can identify the electric grid wires by performing image processing techniques on the overhead images 132. In some examples, the grid wire identifier 150 can combine multiple images of the geographic region in order to generate a combined image. The combined image can include multiple stacked or overlaid images. The combined image may have reduced noise compared to individual images. Analyzing a combined image can improve grid wire estimation compared to analyzing a single image.

For example, a first portion of the grid wires may be occluded in a corresponding portion of an overhead image obtained at a particular time, and might not be occluded in a corresponding portion of an image obtained at another time. The grid wire identifier 150 can select the overhead image in which the first portion of the grid wires is not occluded. The grid wire identifier 150 may select a different overhead image in which a second portion of the grid wires is not occluded. The grid wire identifier 150 can combine the overhead image in which the first portion of the grid wires is not occluded with the different overhead image in which the second portion of the grid wires is not occluded. The grid wire identifier 150 can then analyze the combined image to identify the grid wires and generate masks at locations of grid wires.

In some examples, the grid wire identifier can identify the electric grid wires by analyzing a selected image from a set of overhead images 132. The grid wire identifier 150 may select a single image from the set of overhead images 132 based on the single image showing a longer length of grid wires than other images, or the longest length of grid wires of all of the images.

In some cases, the grid wire identifier 150 may select a single image from the set of overhead images 132 based on the single image showing a clearer depiction of grid wires than other images, or the clearest depiction of grid wires of all of the images. For example, the grid wire identifier 150 may determine a contrast or average contrast between the grid wires and background imagery. The grid wire identifier 150 may select the image having the greatest contrast between the grid wires and the background imagery.

The process 400 includes generating a polyline graph of the identified electric grid wires (406). A polyline is a combination of lines that represents locations, lengths, orientations, and paths of the grid wires. The grid wire identifier 150 can generate polylines representing locations of grid wires using image processing techniques.

For example, the grid wire identifier 150 can run a segmentation model on each image of a set of images to generate a segmented raster. The segmentation process can group pixels that are in close proximity and have similar spectral characteristics are grouped together into a segment. Segments having certain shapes, spectral, and spatial characteristics can then be grouped together into objects. The objects can then be grouped into classes that represent features, e.g., a polyline graph representing grid wires. The segmentation model can produce a segmented raster, with each segment represented by an average value, e.g., an RGB value. Multiple segmented rasters can be combined or overlaid in order to improve accuracy of the polyline graph.

The overhead image 200 shows several features including a road 202. Electric grid wires 210 are located alongside the road 202. The electric grid wires 210 are represented by a polyline 220 having multiple segments, bends, and curves. The overhead image 200 also includes trees 212. Some of the trees 212 occlude portions of the grid wires 210.

Figure 2B:
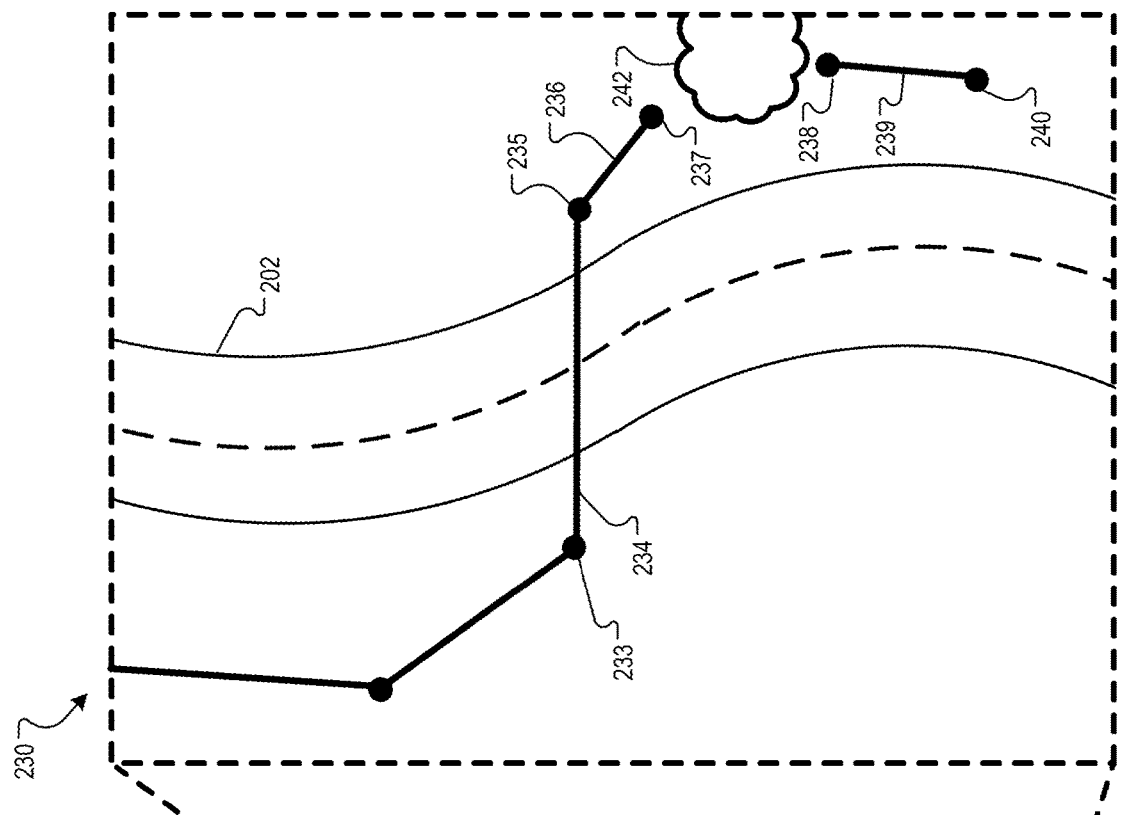
FIGS. 2A to 2D illustrate an overhead view of an example implementation of a process for electrical power grid modeling.
Figure 2A:
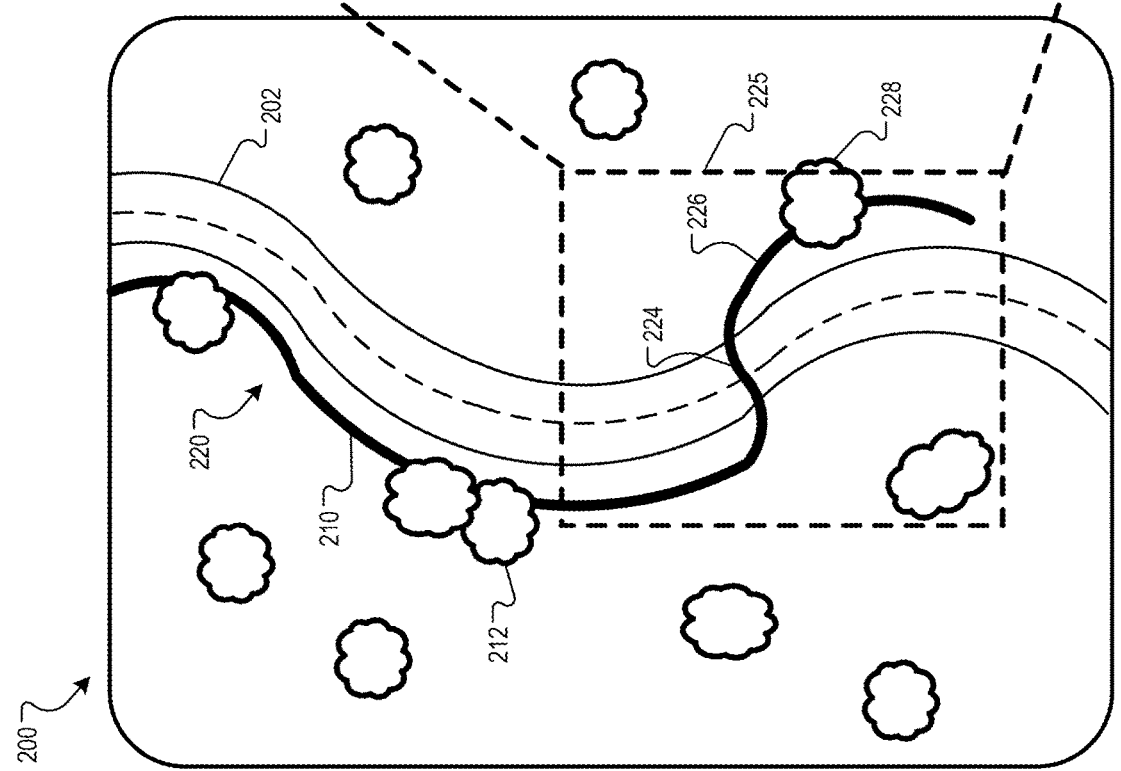

An example overhead image 200 of a geographic region is shown in FIG. 2A. The example overhead image 200 may be a combination of multiple overhead images 132. The example overhead image 200 may also be a single image selected for analysis by the grid wire identifier 150.

The grid wire identifier 150 can perform image processing techniques to improve accuracy of the polyline graph. For example, the segmented rasters may include preliminary polygons that approximate electric grid locations, lengths, and directions. The preliminary polygons are generally wider, or thicker, than the grid wire or set of grid wires. The preliminary polygons can be areas of pixels that form shapes such as rectangles or parallelograms. Each pixel within the polygon can be classified as representing a potential location of a part of a grid wire.

The image processing techniques can include applying a morphological thinning process to the segmented rasters. The grid wire identifier 150 can use morphological thinning to reduce the width of a polygon to produce a polyline that more accurately represents the grid wire. Morphological thinning can include generating a mask at a location of a polygon, and applying a filter around edges of the mask. By applying the filter around the edges of the mask, the mask reduces in size. The mask may reduce in size until the mask approximates the size, shape, and orientation of the grid wire. In some examples, the mask reduces in size until the mask approximates a line with a width of one pixel or several pixels. The image processing techniques can also include polyline simplification and deduplication. These techniques can be used to reduce duplicated lines and to obtain a polyline that more accurately represents the grid wires.

For example, the polyline 220, which may be composed of multiple preliminary polygons, is thicker in relation to background than the real-world grid wires. The grid wire identifier 150 can reduce the thickness of the polyline 220 to better approximate the grid wires 210.

The process 400 includes replacing curves in polylines within the graph with a series of fixed lines and endpoints (408). The grid wire identifier 150 can replace the curves with the series of fixed lines and endpoints.

The polylines are exploded by replacing curved sections with a series of fixed lines and endpoints that approximate the curve. A fixed line can be a straight line as viewed from an overhead view that represents a location and path of a grid wire. An endpoint can be a point in an overhead image that represents a termination of a length of a grid wire.

In some examples, the grid wire identifier 150 can determine to replace a curve of the polyline with a single fixed line or with multiple fixed lines based on a change angle of the curve from an overhead perspective. The change angle of a curve can be an angle between a direction of the polyline on one side of the curve and a direction of the polyline on the other side of the curve.

The grid wire identifier 150 can compare the change angle to a threshold angle. The threshold angle may be, for example, fifteen degrees, twenty degrees, or thirty degrees. The threshold angle can correspond to an angle that is unlikely to occur in an electric grid wire in the absence of a utility pole.

The grid wire identifier 150 can determine to replace a curve with a single fixed line based on the curve having a change angle less than the threshold angle. Alternatively, the grid wire identifier 150 can determine to replace a curve with multiple fixed lines based on the curve having a change angle greater than the threshold angle.

For example, FIG. 2B shows an example modified overhead image 230. The modified overhead image 230 shows a larger view of a portion 225 of the overhead image 200. In the modified overhead image 230, curves of the polyline 220 have been replaced with fixed lines and endpoints. For example, the polyline 220 includes a curve 224. In the modified overhead image 230, the curve 224 has been replaced with fixed line 234, connecting endpoint 233 and endpoint 235. The curve 224 was replaced with a single fixed line 234 due to the curve 224 having a change angle less than the threshold angle.

Gaps in the polyline graph, e.g., where grid wires are occluded by trees 212 or other structures, can be filled by estimating line locations that join non-connected fixed line endpoints. In some examples, the grid wire identifier 150 can apply algorithms such as Kruskal's algorithm to select estimated lines that connect the fixed line endpoints, subject to distance constraints.

Distance constraints can include, for example, a maximum length of a fixed line between endpoints. Distance constraints can be based on a typical length or a maximum length of a grid wire between utility poles. For example, in a particular region or in a particular electrical grid distribution system, utility poles may be spaced no further apart than a maximum distance, e.g., one hundred feet, two hundred feet, or three hundred feet.

For example, the curve 226 is partially occluded by tree 228, as shown in the overhead image 200. In contrast, in the modified overhead image 230, the curve 226 has been replaced with fixed line 236, fixed line 239, and endpoints 237 and 238. The curve 226 was replaced with more than one fixed line, and with at least one endpoint, due to the curve 226 having a change angle greater than the threshold angle.

Fixed line 236 connects endpoint 235 to endpoint 237. Fixed line 239 connects endpoint 238 to endpoint 240. Due to the portion of the curve 226 being occluded by the tree 228, no fixed line connects endpoints 237 to endpoint 238. Thus, endpoint 237 and endpoint 238 are non-connected fixed line endpoints.

The grid wire identifier 150 can estimate a line that connects non-connected fixed line endpoints, e.g., the endpoints 237 and 238. For example, FIG. 2C shows an example modified overhead image 250. The example modified overhead image 250 shows a view of the modified overhead image 230 with an estimated line 252 between the endpoints 237 and 238. The estimated line 252 represents an estimated path of grid wires between the endpoints 237 and 238. The estimated line 252 represents the grid wires that were occluded by the tree 228.

The graph of fixed lines, endpoints, and estimated lines shown in the modified overhead image 250 form a grid wire graph 152. The line estimates of the grid wire graph 152 can be extracted from predictions of models trained on identifying lines in the overhead images 132. The grid wire identifier 150 can output the grid wire graph 152 to the utility pole locator 160 and to the grid asset detector 180.

The process 400 includes identifying a location of a utility pole that supports the electric grid wires (410). The utility pole locator 160 can receive the grid wire graph 152 from the grid wire identifier 150. The utility pole locator can then identify locations of utility poles within the grid wire graph 152.

The utility pole locator 160 can use the grid wire graph 152 to identify the locations of utility poles. For example, the utility pole locator 160 can estimate utility pole locations based on characteristics of the fixed lines and endpoints. Such characteristics that are indicative of a utility pole include, for example, endpoints that terminate a length of wire, a junction between two or more lines, an angle greater than a threshold value between two lines meeting at an endpoint, at estimated distances along an extended length line from a known pole location.

In some implementations, the utility pole locator 160 can use a trained machine learning algorithm to identify utility pole locations 162. The machine learning algorithm can include, e.g., a neural network model. The machine learning algorithm can be pre-trained, for example, using human-labeled imagery. The imagery can be labeled with locations of utility poles in a grid wire graph.

In some implementations, the utility pole locator 160 can be programmed with rules. The utility pole locator 160 can locate the utility poles based on the rules. Some example rules for locating utility poles are as follows.

An example rule may establish that any endpoint in the grid wire graph 152 is likely a utility pole. Another example rule may establish that any junction of more than two fixed lines is likely a utility pole, and that any curve or bend greater than a threshold change angle is likely a utility pole.

An example rule may also establish that, for fixed lines longer than a threshold length, at least one utility pole is likely located along the fixed line. For example, the rule may state that for fixed lines longer than two hundred feet, at least one utility pole is located along the fixed line. A rule may state that in certain cases, the utility pole is likely at a midpoint of the fixed line. As an example, the rule may state that for fixed lines longer than two hundred feet, but less than three hundred feet, the utility pole is likely located at the midpoint of the fixed line.

In another example, a rule may establish that the utility pole is likely at an integer multiple of a median distance between utility poles from known utility pole locations along the fixed line. For example, the utility pole locator 160 may determine that a median distance between utility poles in a geographic region where the electric grid wires are located is one hundred feet. The rule may therefore establish that the utility pole is likely located at multiples of one hundred feet between endpoints. The utility pole locator 160 can then locate a utility pole along the fixed line at a location that is one hundred feet away from another utility pole.

Figure 2D:
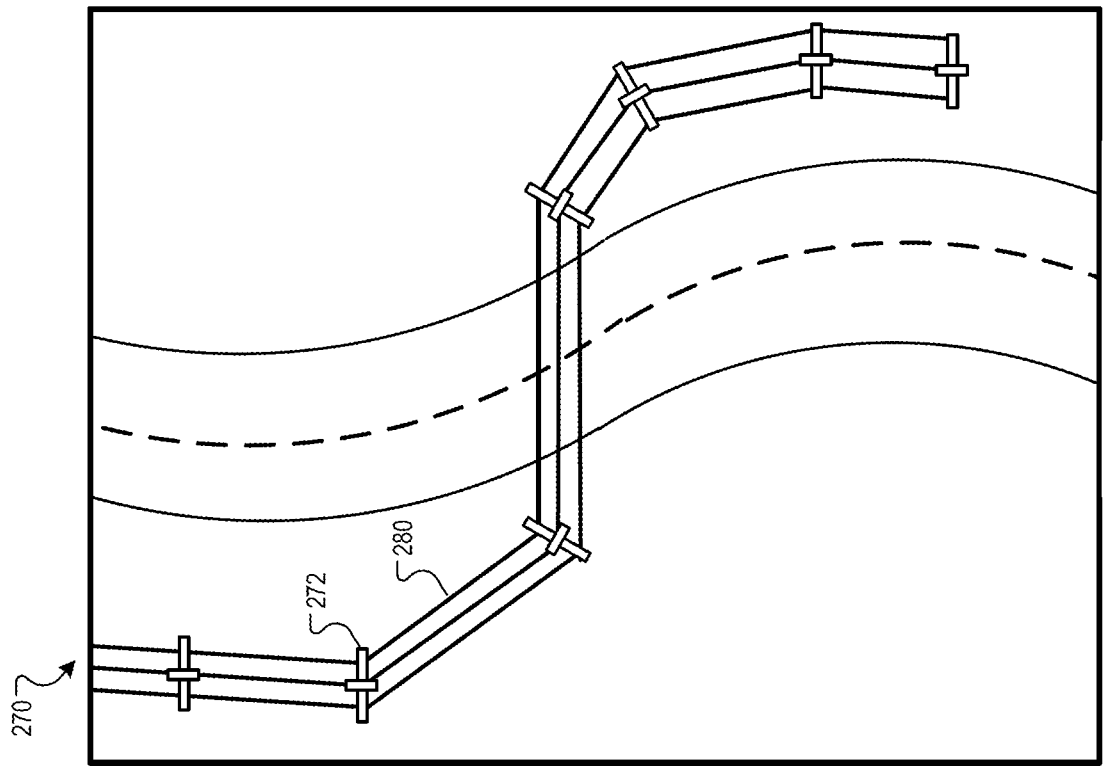
Figure 2C:
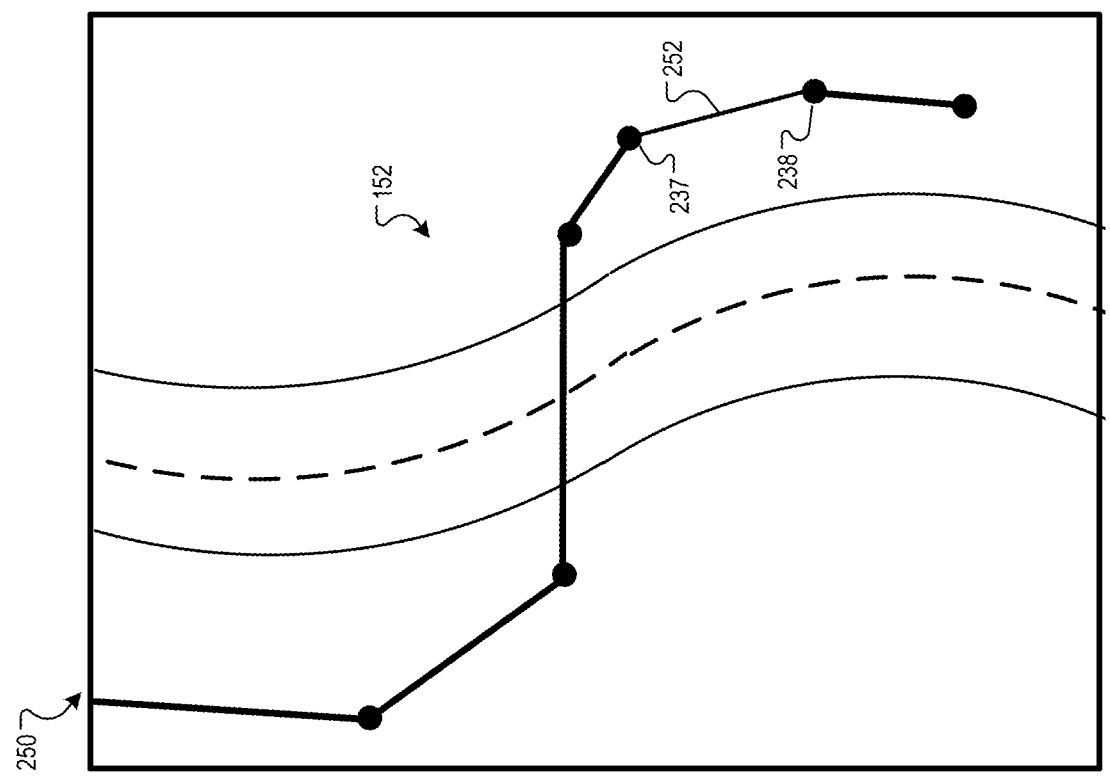

FIG. 2D shows an example modified overhead image 270. The modified overhead image 270 shows a view of the modified overhead image 250 with utility pole locations 272 identified. The modified overhead image 270 also includes representations of individual grid wires 280 connecting the utility pole locations. The three individual grid wires 280 shown in FIG. 2D represent a three phase alternating current distribution system. The utility pole locator 160 can generate representations of individual grid wires 280, for example, by duplicating each of the fixed lines and the estimated lines of the grid wire graph 152.

The utility pole locator 160 outputs a utility pole location 162 to the grid asset detector 180. The utility pole location 162 can include, for example, a latitude and longitude of a utility pole. In some examples, the utility pole location 162 can include an address of the utility pole, an intersection of the utility pole, or other geographic location data.

As described above, overhead imagery data 112 can be used to determine a network layout including identifying grid wire and utility pole locations. Additional information about the electric grid can be determined from street level images and surfel data. The additional information can include information related to connectivity of individual grid wires. For example, street level images and surfel data can be used to distinguish primary grid wires from secondary grid wires, and to determine a number of primary and secondary grid wires connected to a particular utility pole. The street level images and surfel data can also be used to differentiate three-phase distribution systems from single-phase distribution systems.

The process 400 includes detecting an electric grid asset from street level imagery at the location of the utility pole (412). The grid asset detector 180 can use the estimated utility pole location 162 to identify street level images 142 for inspection.

For example, the grid asset detector 180 can correlate the utility pole location from the grid wire graph 152 to the street level data store 140. The grid asset detector 180 can select street level images 142 of a region near the utility pole location 162. By applying object detection algorithms to the selected street level images 142, the grid asset detector 180 can identify or detect the existence of various electric grid assets. Grid assets can include, for example, transformers, capacitors, crossarms, risers, insulators, reclosers, switch handles, switch control rods, voltage regulators, feeders, etc., that may be connected to, located on, or located near the utility pole.

The server system 102 can receive street level imagery data 122 from street level sensors 120. Street level sensors 120 can include, for example, sensors that receive reflections of electromagnetic radiation, e.g., LIDAR systems that detect reflections of laser light, radar systems that detect reflections of radio waves, and camera systems that detect reflections of visible light.

The server system 102 can store the street level imagery data 122 in a database, e.g., the street level data store 140. The server system 102 can detect the electric grid asset from street level imagery using the grid asset detector 180. The grid asset detector 180 can obtain street level images 142 from the street level data store 140, the grid wire graph 152 from the grid wire identifier 150, and utility pole location 162 from the utility pole locator 160.

In some examples, the grid asset detector 180 can obtain the utility pole location 162 and then retrieve corresponding street level images 142 for the utility pole location 162. The corresponding street level images 142 can include images generated by image sensors located at the utility pole location 162.

Figure 3A:
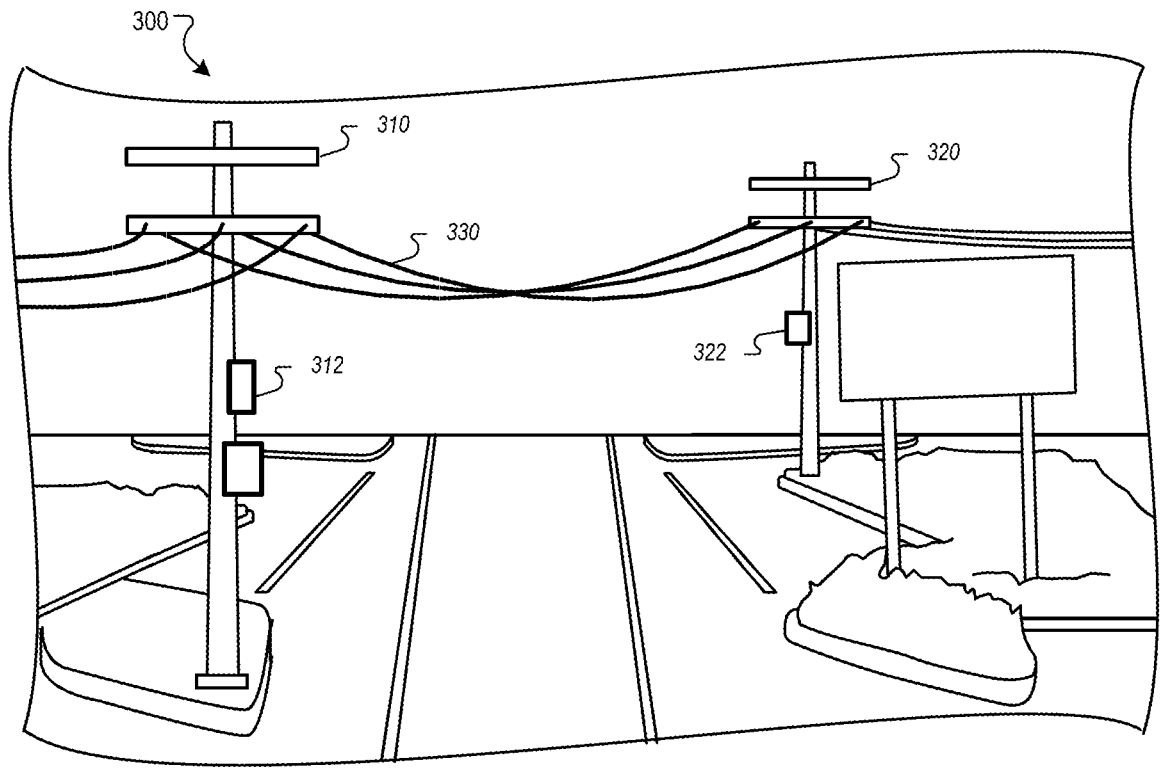
FIGS. 3A to 3F illustrate example implementations of a process for electrical power grid modeling using surfel data.

An example street level view 300 of street level images 142 of a geographic location is shown in FIG. 3A. The street level view 300 may be depicted, for example, from the point of view of a sensor onboard a vehicle.

The street level view 300 shows several features including a utility pole 310 and a utility pole 320. The utility pole 310 and the utility pole 320 are connected by electric grid wires including electric grid wire 330. A grid asset 312 is located on the utility pole 310, and a grid asset 322 is located on the utility pole 320. The grid assets 312 and 322 may each be, for example, a capacitor, a transformer, or a switch.

The grid asset detector 180 can detect electric grid assets by performing image analysis on the street level images 142. For example, the grid asset detector 180 can apply algorithms for object detection and object identification to the street level images 142.

Based on analyzing the street level images 142, the grid asset detector 180 can produce grid asset data 184. The grid asset data 184 can include, for example, a geographic location of a grid asset, e.g., the grid asset 312. The grid asset data 184 can also include an identification of the utility pole 310 to which the grid asset 312 is mounted. In some examples, the grid asset data 184 may include additional data, e.g., a classification of the grid asset, an on/off status of the grid asset, a power rating of the grid asset, a height or elevation of the grid asset, etc.

The process 400 includes generating a representation of the detected electric grid asset for use in a model of the electric grid (414). The system can then add the representation of the detected grid asset to an existing model of the electric grid. In some cases the system can generate a model of the electric grid based on generated representations of electric grid assets.

The model of the electric grid can include a high resolution model of one or more electrical distribution feeders. The electric grid model 190 can include, for example, data models of substation transformers, medium voltage distribution lines, distribution switches and reclosers, fixed and switched capacitors, voltage regulation schemes, e.g., tapped magnetics or switched capacitors, network transformers, load transformers, inverters, generators, and various loads. The electric grid model 190 can also include transformer locations and capacities, feeder locations and capacities, and load locations.

The model of the electric grid can include virtual representations of power lines of an electrical grid including primary grid wires, secondary grid wires, and service cables that connect to loads such as residential, commercial, and industrial properties. The model of the electric grid can also include virtual representations of electrical transformers located between power plants and loads. On one side of an electrical transformer, the transformer can be connected to a primary grid wire that is connected through a primary distribution system to a power source. On another side of the electrical transformer, the transformer can be connected to a secondary grid wire that is connected through a secondary distribution system to electric loads.

The grid asset detector 180 can provide the grid asset data 184, e.g., grid asset data 184 for the grid asset 312, to the electric grid model 190. The electric grid model 190 can then add a representation of the grid asset 312 to the electric grid model 190. Adding the representation of the grid asset 312 to the electric grid model 190 can improve accuracy of the electric grid model 190. Adding the representation of the grid asset 312 to the electric grid model 190 can improve accuracy of monitoring and/or simulating electrical power grid operations using the electric grid model 190.

The system 100 can also be used to perform a process 500 for modeling electrical power grid wires. A flow diagram of the process 500 is illustrated in FIG. 5.

The process 500 includes obtaining a set of surfels, where each surfel of the set of surfels represents a portion of a surface of an object in a geographic region (502).

In some examples, the process 500 includes selecting the geographic region. The server system 102 can select the geographic region, for example, by determining, based on overhead imagery of the geographic region, that the geographic region likely includes at least one electric grid wire. In some examples, the server system 102 can select the geographic region by determining that the geographic region likely includes at least one utility pole or power line.

In some examples, the server system 102 obtains surfels from ranging data. In some examples, the server system 102 obtains ranging data of a geographic location that includes a utility pole. The ranging data 144 can include, for example, RADAR data or LIDAR data. The ranging data can be collected by street level sensors 120. The ranging data 144 can be stored in the street level data store 140.

The ranging data 144 generated by a given street level sensor 120 generally indicates a distance, a direction, and an intensity of reflected radiation. For example, a sensor can transmit one or more pulses of electromagnetic radiation in a particular direction and can measure the intensity of any reflections as well as the time that the reflection was received. A distance can be computed by determining how long it took between a pulse and its corresponding reflection. The sensor can continually sweep a particular space in angle, azimuth, or both. Sweeping in azimuth, for example, can allow a sensor to detect multiple objects along the same line of sight.

Ranging data such as LIDAR data can be used to create high-resolution models with high accuracy. To generate LIDAR data, a laser scanner transmits brief pulses of light towards objects. Those pulses are reflected or scattered back and their travel time is used to calculate the distance between the laser scanner and the object. LIDAR data can be collected as a "point cloud" of individual points reflected from every object within the field of view of the LIDAR sensor. Each pixel of a LIDAR image can be assigned a pixel value corresponding to the distance between the corresponding point of the object and the LIDAR sensor.

The street level sensors 120 can classify groups of ranging data 144 from one or more sensors as being measures of an object of a particular type. A group of sensor measurements can be represented in any of a variety of ways, depending on the kinds of sensor measurements that are being captured. For example, each group of laser sensor measurements can be represented as a three-dimensional point cloud, with each point having an intensity and a position. In some implementations, the position is represented as a range and height pair. Each group of camera sensor measurements can be represented as an image patch, e.g., an RGB image patch.

In some examples, the process 500 includes converting the ranging data into a set of surfels. The server system 102 can convert the ranging data 144 into a set of surfels, e.g., surfel data 148, using the surfel generator 146. The surfel generator 146 can generate the set of surfels from the ranging data.

In some examples, the process 500 includes obtaining a set of surfels from a database of surfels, e.g., surfel data store 145 or external surfel data source 147. The surfel data store 145, the external surfel data source 147, or both, can store surfels generated from ranging data obtained from multiple geographic regions.

Figure 3B:
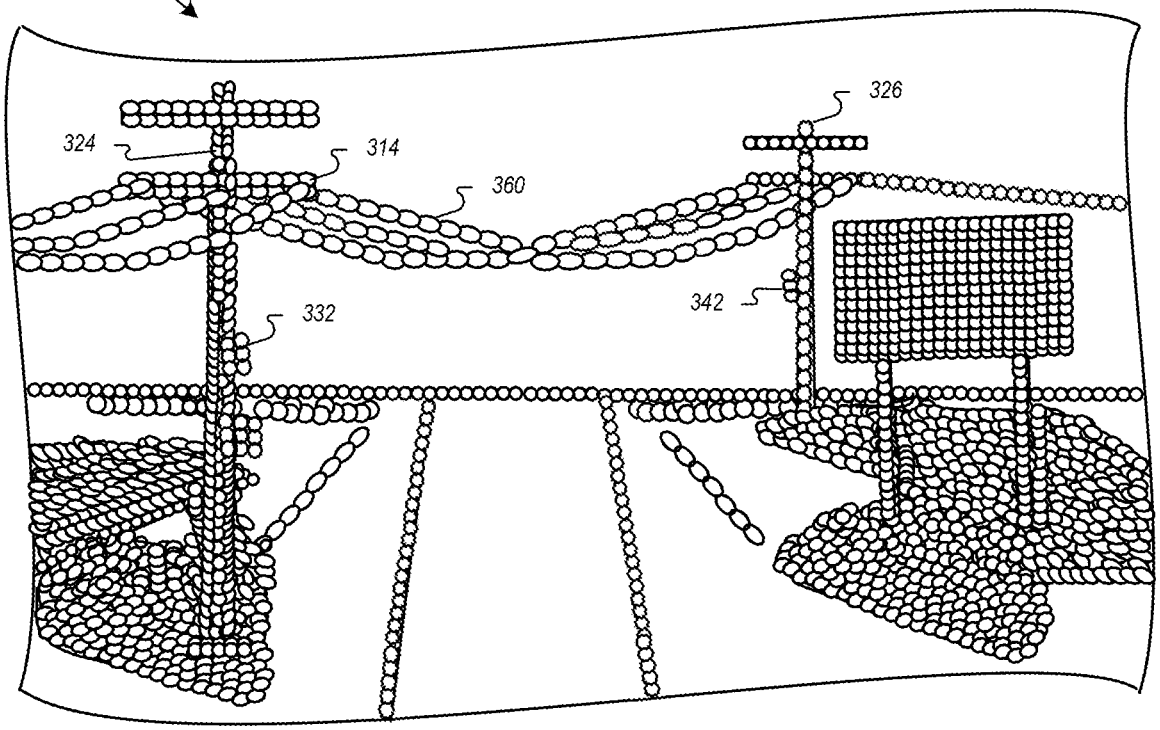

FIG. 3B is an illustration of an example surfel view 350 of the geographic location shown in the street level view 300 of FIG. 3A. The surfel view 350 shown in FIG. 3B includes utility pole surfels 324, 326 representing surfaces of the utility poles 310, 320, respectively, and crossarm surfels 314 representing a crossarm of the utility pole 310. The surfel view 350 also includes wire surfels 360 representing surfaces of the electric grid wire 330, and asset surfels 332, 342 representing surfaces of the grid assets 312, 322, respectively. In FIG. 3B, the wire surfels 360 are tubular and approximately horizontal. The wire surfels 360 have a height that is similar to the height of the crossarm surfels 314. In contrast, the utility pole surfels 324, 326 are circular, and have varying heights between the bases of the utility poles and the tops of the utility poles. The asset surfels 332 are circular and have a height below the height of the crossarm surfels 314.

Surfels can be generated from subsampling ranging data such as LIDAR data. In general, surfels have a lower resolution than ranging data. Surfels can be encoded with data indicating geometric properties of surfaces. Thus, surfels can be used to represent features of three-dimensional objects using a smaller amount of data than the corresponding ranging data. A surfel includes data that represents a two-dimensional surface that corresponds to a particular three-dimensional coordinate system in an environment. The surfels approximate the shapes of various objects located within the region near the utility pole. A surfel includes data representing a position and an orientation of the two-dimensional surface in the three-dimensional coordinate system.

In some examples raw ranging data, e.g., the ranging data 144, can be used to identify grid assets. The ranging data 144 can be, for example, LIDAR data that is not subsampled. In these examples, the processes described with reference to FIGS. 3A to 3F can be performed using LIDAR points instead of, or in combination with, surfel data. Each LIDAR point may correspond to a point of an object within a LIDAR image, rather than to a surface of the object.

Surfels can characterize a real-world environment, e.g. a particular portion of a city block in the real world, or a simulated environment, e.g. a virtual intersection that is used to simulate autonomous driving decisions to train one or more machine learning models. As a particular example, a surfel dataset characterizing a real-world environment can be generated using sensor data that has been captured by street level sensors 120 operating in the real-world environment, e.g. sensors on-board a vehicle navigating through the environment.

The position and orientation of a surfel can be defined by a corresponding set of coordinates. For example, a surfel can be defined by spatial coordinates, e.g., (x, y, z) defining a particular position in a three-dimensional coordinate system, and orientation coordinates, e.g., (pitch, yaw, roll) defining a particular orientation of the surface at the particular position. As another example, a surfel can be defined by spatial coordinates that define the particular position in a three-dimensional coordinate system and a normal vector, e.g. a vector with a magnitude of one, that defines the orientation of the surface at the particular position. The location of a surfel can be represented in any appropriate coordinate system. In some implementations, a system can divide the environment being modeled to include volume elements (voxels) and generate at most one surfel for each voxel in the environment that includes a detected object. In some other implementations, a system can divide the environment being modeled into voxels, where each voxel can include multiple surfels; this can allow each voxel to represent complex surfaces more accurately. In some other implementations, a single surfel dataset can contain surfels of various different sizes that are not organized within a fixed spatial grid.

For any latitude and longitude in the environment, i.e. for any given (latitude, longitude) position in a plane running parallel to the ground of the environment, the surfel dataset can include multiple different surfels each corresponding to a different altitude in the environment, as defined by the altitude coordinate of the surfel. This represents a distinction between some existing techniques that are "2.5-dimensional," i.e., techniques that only allow a map to contain a single point at a particular altitude for any given latitude and longitude in a three-dimensional map of the environment. These existing techniques can sometimes fail when an environment has multiple objects at respective altitudes at the same latitude and longitude in the environment. For example, such existing techniques would be unable to capture both an overpass in the environment and the road underneath the overpass. The surfel dataset, on the other hand, is able to represent both the overpass and the road underneath the overpass, e.g. with an overpass surfel and a road surfel that have the same latitude coordinate and longitude coordinate but a different altitude coordinate.

A surfel can also include size and shape parameters. A surfel can have any appropriate shape. For example, a surfel can be a square, a rectangle, an ellipsoid, or a two-dimensional disc, to name just a few examples. The shape of a surfel can provide an inferred geometry of the object that the surfel represents.

In some examples, the grid asset detector 180 can receive the ranging data 144 directly from the street level data store 140. That is, the grid asset detector 180 can receive the ranging data 144 that has not been converted to surfel data 148. In these examples, the grid asset detector 180 can use the ranging data to identify assets such as grid wires. For example, the grid asset detector 180 can fit catenary models to the ranging data 144 in order to identify grid wires.

The surfel generator 146 can convert the ranging data 144 to the surfel data 148 and output the surfel data 148 to the grid asset detector 180. In some examples, the grid asset detector 180 can obtain surfel data from a surfel data store 145. In some examples, the grid asset detector 180 can obtain surfel data from an external surfel data source 147. The surfel data store 145, the external surfel data source 147, or both, can store surfel data for multiple geographic regions.

Figure 3C:
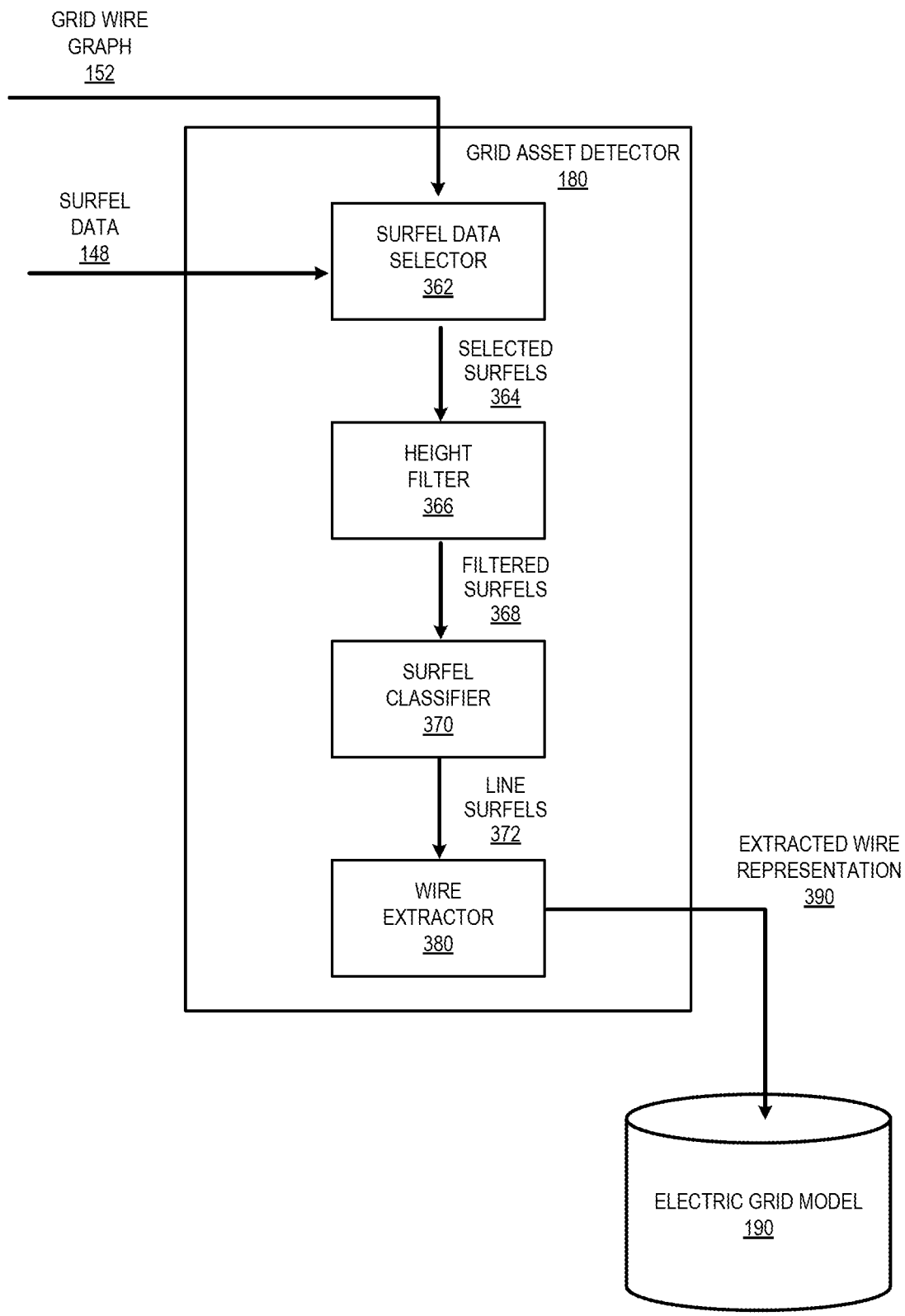

Referring to FIG. 3C, the grid asset detector 180 can include a surfel data selector 362, a height filter 366, a surfel classifier 370, and a wire extractor 380.

In some examples, the grid asset detector 180 can use the grid wire graph 152 to select surfel data 148 for inspection and analysis. For example, the surfel data selector 362 can correlate the grid wire graph 152 to the street level data store 140. The surfel data selector 362 can select surfel data 148 of a region near lines of the grid wire graph 152. For example, the surfel data selector 362 can select surfel data 148 of a region within a threshold distance to the lines of the grid wire graph 152. The surfel data selector 362 can output selected surfels 364 to the height filter 366.

The process 500 includes selecting, based on one or more surfel attributes, one or more surfels of the set of surfels that each represent a portion of a surface of an electric grid wire (504). Surfel attributes can include, for example, a shape, a location, a height, a texture, a color, a depth, or an orientation of the surfel. The grid asset detector 180 can classify characteristics of surfels, for example, by classifying the general shape (e.g., tubular or round) and orientation (e.g., vertical or horizontal) of each surfel. Characteristics of surfels can also include a location and a height of the surfels.

In some examples, selecting a surfel that represents a portion of a surface of an electric grid wire includes determining that the surfels has a height that satisfies height criteria for representing an electric grid wire. Determining that the surfel has a height that satisfies height criteria for representing an electric grid wire can include classifying the surfel as having a height greater than a minimum height above a ground surface.

Figure 3D:

FIG. 3D shows example selected surfels 364 of a geographic region. FIG. 3D shows surfels representing grid wires 382, utility poles 384, and vegetation 386. The height filter 366 can filter out selected surfels 364 that do not meet criteria for representing an electric grid wire. For example, the height filter 366 can filter out surfels that are too low to the ground, e.g., surfels that have a height that is less than the minimum height above the ground surface. Filtering out surfels that are too low to the ground can reduce interference caused by objects such as small buildings and bushes.

In some examples, the height filter 366 can filter out surfels that are too high above the ground, e.g., surfels that have a height that is greater than a maximum height above the ground surface. Filtering out surfels that are too high above the ground can reduce interference caused by objects such as tall buildings and trees.

Figure 3E:
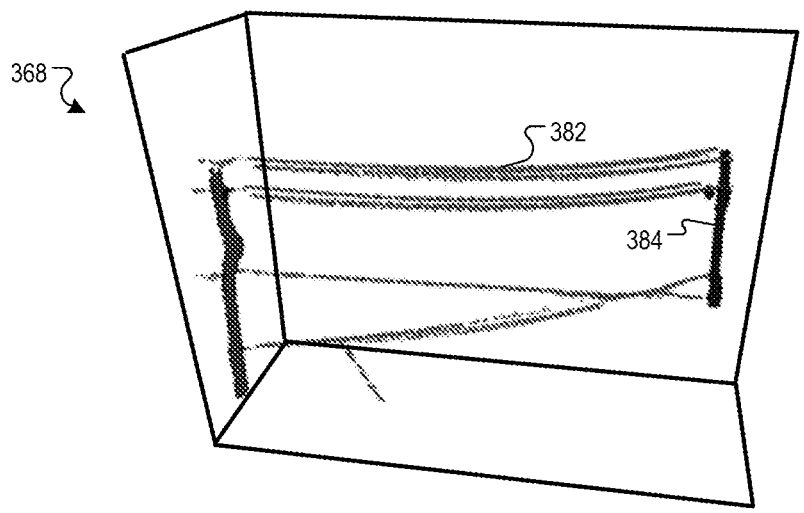

In the example of FIG. 3D, the height filter 366 can filter out the surfels that have a height that is less than a minimum height above the ground surface. Thus, the height filter 366 can filter out surfels that represent the vegetation 386. The height filter 366 can output filtered surfels 368 that satisfy the height criteria. FIG. 3E shows an example set of filtered surfels 368 that were generated from the selected surfels 364 shown in FIG. 3D. The filtered surfels 368 in FIG. 3E satisfy height criteria applied by the height filter 366. The filtered surfels 368 include the surfels representing the grid wires 382 and the utility poles 384, but not the vegetation 386.

In some examples, surfels can be encoded with location data in Earth centered Earth Fixed (ECEF) coordinates, e.g., coordinates with reference to the center of the earth. In order to estimate the height above the ground surface, the height filter 366 can transform the surfel location data to coordinates with reference to the ground surface in the geographic region. The height filter 366 can store data indicating an elevation and orientation of the ground surface in multiple geographic regions. The height filter 366 can then apply a transformation matrix to the surfel location data based on the geographic region of the selected surfels 364. By applying the transformation matrix, the surfels can be projected to a coordinate system with reference to the ground surface.

In some examples, the height filter 366 can apply height criteria based on the geographic region of the selected 364 surfels. For example, in certain geographic regions, electric grid wire may be located at higher elevations, and in other geographic regions, electric grid wires may be located at lower elevations. The height filter 366 can store data indicating typical electric grid wire heights in different geographic regions. The height filter 366 can filter out surfels that do not satisfy the height criteria for the geographic region of the selected surfels 364.

The height filter 366 outputs the filtered surfels 368 to the surfel classifier 370. The filtered surfels 368 include surfels of the selected surfels 364 that satisfy height criteria for representing an electric grid wire.

The surfel classifier 370 performs classification of the filtered surfels 368. For example, the surfel classifier 370 can classify each of the filtered surfels 368 based on attributes such as shape and orientation. The surfel classifier 370 can then determine, for each filtered surfel 368, whether the filtered surfel 368 satisfies criteria for classification as a line surfel 372. Criteria for classification as a line surfel 372 can include, for example, shape criteria and orientation criteria. The surfel classifier 370 can output the line surfels 372 to the wire extractor 380.

The surfel classifier 370 can perform geometric filtering and classification on the filtered surfels 368. As a result of the geometric filtering, surfels that are line-like, e.g., having a tubular shape, are selected. A tubular shape can be defined as a three-dimensional shape in which one axis is longer than the other two axes. Surfels that are not line-like, e.g., surfels that have a circular or near circular shape, can be filtered out. The line surfels 372 that are identified through the geometric filtering may represent linear objects such as electric grid wires, utility poles, and trees. The line surfels 372 are provided to the wire extractor 380 to further filter the surfels in order to identify surfels that represent the grid wires.

To identify surfels that can be classified line surfels 372, the surfel classifier 370 can select surfels that have a shape that satisfies shape criteria for representing an electric grid wire. Determining that a surfel has a shape that satisfies shape criteria for representing an electric grid wire can include classifying the surfel as having a tubular shape, e.g., a shape similar to an elongated ellipsoid.

To identify surfels that can be classified line surfels 372, the surfel classifier 370 can select surfels that have an orientation that satisfies orientation criteria for representing an electric grid wire. Determining that a surfel has an orientation that satisfies orientation criteria for representing an electric grid wire can include classifying the surfel as having an approximately horizontal orientation, e.g., an orientation that is approximately parallel to a ground surface. The orientation criteria can include, for example, a maximum angular difference between the ground surface and the surfel orientation. Surfels that have an orientation that is not horizontal or near horizontal can be filtered out. For example, surfels corresponding to utility poles likely have a vertical or near vertical orientation and can be filtered out by the surfel classifier.

Figure 3F:
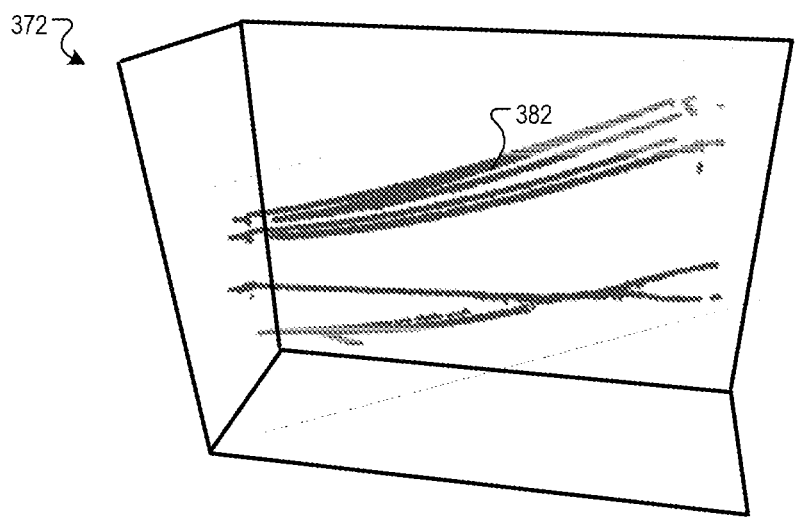

In the example of FIG. 3E, the surfel classifier 370 can filter out the surfels that have an orientation that is not horizontal or near horizontal. Thus, surfel classifier 370 can filter surfels that represent the utility poles 384. The surfel classifier 370 can output line surfels 372 that satisfy the shape and orientation criteria. FIG. 3F shows an example set of line surfels 372 that were generated from the filtered surfels 368 shown in FIG. 3E. The line surfels 372 in FIG. 3F satisfy the shape and orientation criteria applied by the surfel classifier. The line surfels 372 include the surfels representing the grid wires 382, but not the utility poles 384.

In some implementations, the grid asset detector 180 can use a trained machine learning algorithm to identify line surfels 372. For example, the grid asset detector 180 can process the surfel data using a surfel classification model that is trained to identify surfels that represent surfaces of electric grid wires. The surfel classification model can use a machine learning algorithm, e.g., a neural network model. The machine learning algorithm can be pre-trained, for example, using human-labeled surfel images. In some examples, the machine learning algorithm can be trained using human-labeled LIDAR images. The images can be labeled with locations of grid assets such as utility poles, power lines, transformers, etc.

The grid asset detector 180 can use the pre-trained machine learning algorithm to classify surfels as corresponding to a grid wire or other grid asset. In some examples, the grid asset detector 180 can use the pre-trained machine learning algorithm to classify LIDAR points as corresponding to a grid wire or other grid asset. In some examples, LIDAR points that are classified as corresponding to a grid asset can be subsampled to generate surfel data. The surfel generated from the classified LIDAR points can maintain the classification of corresponding to the grid asset.

The surfel classifier 370 can output the line surfels 372 to the wire extractor 380. The line surfels 372 can be considered to satisfy initial criteria. Initial criteria can include, for example, height criteria, shape criteria, and orientation criteria. The wire extractor 380 can extract wire representations from the set of line surfels that satisfy the initial criteria.

The wire extractor 380 can extract wire representations by determining which line surfels 372 are part of a cluster of line surfels. A cluster of line surfels can include two or more line surfels 372 that are located within a threshold distance to each other. For example, the wire extractor 380 can determine centroids of multiple surfels are within a certain distance to each other, and therefore that the multiple surfels form a cluster. The wire extractor 380 can identify surfel clusters, e.g., using connected component analysis to identify surfels that are within a threshold radial distance to one another.

In some examples, the cluster of surfels includes two or more surfels that are each located within a threshold distance to at least one other surfel of the cluster. In some examples, selecting one or more surfels of the set of surfels that each represent a portion of a surface of an electric grid wire includes determining that a location of an end point of the cluster of surfels corresponds to the estimated end point of the electric grid wire. For example, the wire extractor 380 can determine, based on overhead imagery of the geographic region, an estimated end point of the electric grid wire. The wire extractor 380 can compare an end point of a cluster of surfels to the predicted end point of the electric grid wire. If the location of the end point of the cluster of surfels satisfies similarity criteria for matching the location of the predicted end point of the electric grid wire, the wire extractor 380 can determine that the cluster of surfels represents the grid wire.

In some examples, selecting one or more surfels of the set of surfels that each represent a portion of a surface of an electric grid wire includes determining that a location of an end point of the cluster of surfels corresponds to the estimated location of the utility pole. For example, the wire extractor 380 can estimate a location of a utility pole using overhead imagery of the geographic region, using the set of surfels, or both. The wire extractor 380 can compare the endpoint of a cluster of surfels to the predicted end point of the electric grid wire. If the location of the end point of the cluster of surfels satisfies similarity criteria for matching the location of the predicted end point of the electric grid wire, the wire extractor 380 can determine that the cluster of surfels represents the grid wire.

Although FIG. 3C shows the height filter 366 filtering surfels before the surfel classifier 370 performs classification, other orderings are possible. For example, in some cases the surfel data selector 362 can provide the selected surfels 364 to the surfel classifier 370, and the surfel classifier 370 can perform classification on the selected surfels 364. The surfel classifier 370 can provide the line surfels 372 to the height filter 366. The height filter 366 can then filter the line surfels 372 and provide the filtered surfels 368 to the wire extractor 380.

The system can identify individual wires extending from the utility pole based on the characteristics of surfels. The system can correlate the individual wires to either known grid wires (e.g., from the graph based representation of the power lines) or identify the wires as likely grid wires (e.g., based on a non-correlation).

In some examples, multiple grid wires may connect to a utility pole at multiple heights. For example, a first grid wire may connect to the utility pole at a midpoint of the height of the utility pole, and a second grid wire may connect to the utility pole near a top of the utility pole. From an overhead view, the multiple grid wires may overlap and appear as a single line. The wire extractor 380 can identify the individual overlapping grid wires by analyzing the surfel data 148. For example, the wire extractor 380 can bin wire surfels together with other wire surfels at similar heights. The wire extractor 380 can then determine feeder height based on the heights of the wire surfels.

For example, a first grid wire may connect to a utility pole at a height of twenty feet above ground. A second grid wire may connect to the utility pole at a height of forty feet. The wire extractor 380 can identify wire surfels based on characteristics of the surfels, as described above. The wire extractor 380 can then bin the wire surfels based on their heights. Surfels with heights clustering around a lower height can be assigned to a first bin. Surfels with heights clustering around a higher height can be assigned to a second bin. The wire extractor 380 can then determine that the utility pole is connected to two different grid wires.

The wire extractor 380 can estimate the heights of the grid wires based on the heights of the wire surfels. For example, the wire extractor 380 can calculate an average height of surfels in the first bin to estimate the height of the first feeder. The wire extractor 380 can calculate an average height of surfels in the second bin to estimate the height of the second grid wire. The extracted wire representation 390 for a grid wire can therefore include the estimated height of the grid wire based on the average height of surfels that represent surfaces of the grid wire.

Since more than one grid wire can extend between two utility poles, each line surfel 372 located between two utility poles can represent a surface of one of a number of different grid wires. The wire extractor 380 can perform a geometric curve-fitting process to fit continuous curves to the line surfels 372. In some examples, the wire extractor 380 can perform the geometric curve-fitting process to fit continuous curves to raw ranging data points, e.g., LIDAR points of a LIDAR image. The curves can be used to identify the individual grid wires and assign each line surfel 372 to a grid wire. Using a curve fitting process can enable the wire extractor 380 to identify individual grid wires, even when the grid wires are located close to each other, e.g., when grid wires are overlapping or criss-crossing.

Grid wires typically follow a catenary curve, therefore the wire extractor 380 can use the curve fitting process to extract parameters of the catenary curves represented by the surfels. The wire extractor 380 can apply an algorithm such as a random sample consensus (RANSAC) algorithm to generate the curves. Given data containing a number of inliers and outliers, the RANSAC algorithm can estimate the model parameters that best fit the surfel data. The generated geometric curves can be, for example, any combination of straight lines, catenary curves, parabolic curves, or bezier curves.

A quadratic bezier curve is defined by three points, including two end points and one central point. To fit a bezier curve to line surfels 372, the wire extractor can select two line surfels 372 and determine a distance between the two surfels. If the two surfels are closer than a minimum threshold distance apart from each other, the surfels are discarded and two different surfels are selected. If the two surfels are greater than a minimum threshold distance apart from each other, the wire extractor 380 assigns the surfels as a first end point and a second end point of a bezier curve.

Once the wire extractor 380 assigns surfels as the first end point and the second end point, the wire extractor 380 can determine the central point between the two surfels. To determine the central point, the wire extractor 380 determines the line vectors of the two surfels. Since the two surfels are line surfels, the surfels have one axis that is longer than the other two axes. The line vector of each surfel can be established as a vector that extends along the long axis of the surfel.

If the line vectors of the first end point surfel and of the second end point surfel intersect, the wire extractor can assign the intersecting point as the central point of the bezier curve. Since the vectors are three-dimensional, it is likely that the two line vectors will not intersect. If the two line vectors do not intersect, the wire extractor 380 can determine a closest point of approach between the two line vectors, and determine a connecting vector between the two line vectors at the closest point of approach. The wire extractor 380 can then assign a center point of the connecting vector as the central point of the bezier curve.

To verify the central point, the wire extractor 380 can determine whether the latitude and longitude of the central point falls between the latitude and longitude of the first end point and of the second end point. If the latitude and longitude falls between the latitude and longitude of the first end point and of the second end point, the wire extractor 380 can generate a bezier curve from the two end points and the central point. The wire extractor 380 can repeat the process until all of the line surfels 372 are assigned to a curve, where each curve represents an individual grid wire.

In some examples, the wire extractor 380 can use identified locations of utility poles as end points in the curve-fitting process. For example, the wire extractor 380 can identify all of the line surfels 372 that are located between two utility poles. The wire extractor 380 can then fit curves to the line surfels 372, such that each curve starts and ends at a utility pole, and each line surfel 372 is mapped to a curve.

Referring to FIG. 3B, the grid asset detector 180 can determine that the wire surfels 360 represent an electric grid wire based on the wire surfels having a tubular shape, an approximately horizontal orientation, a height that corresponds to a line height, and being clustered with other wire surfels 360.

The process 500 includes generating a representation of the electric grid wire from the selected one or more surfels (508). For example, the wire extractor 380 can output extracted wire representation 390 to the electric grid model 190. The representation of the electric grid wire includes at least one of a geographic location, a size, a height, a classification, or a cardinal orientation of the electric grid wire. The extracted wire representation 390 can include a virtual representation of a grid wire, including, for example, a height of the wire, a starting point of the wire, an end point of the wire, and a length of the wire.

The process 500 includes adding a representation of the detected electric grid line to a model of the electric grid (510). The grid asset detector 180 can provide grid asset data 184, including an extracted wire representation 390, to the electric grid model 190. Adding the extracted wire representation 390 to the electric grid model 190 can improve accuracy of the electric grid model 190. Adding the extracted wire representation 390 to the electric grid model 190 can improve accuracy of monitoring and/or simulating electrical power grid operations using the electric grid model 190.

Implementations of the subject matter and the functional operations described in this specification can be implemented in digital electronic circuitry, in tangibly-implemented computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible non-transitory program carrier for execution by, or to control the operation of, data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including, by way of example, a programmable processor, a computer, or multiple processors or computers. The apparatus can also be or further include special purpose logic circuitry, e.g., a central processing unit (CPU), a FPGA (field programmable gate array), or an ASIC (application-specific integrated circuit). In some implementations, the data processing apparatus and/or special purpose logic circuitry may be hardware-based and/or software-based. The apparatus can optionally include code that creates an execution environment for computer programs, e.g., code that constitutes processor firmware, a protocol stack, a database management system, an operating system, or a combination of one or more of them. The present disclosure contemplates the use of data processing apparatuses with or without conventional operating systems, for example Linux, UNIX, Windows, Mac OS, Android, iOS or any other suitable conventional operating system.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third party services, components, libraries, and such, as appropriate. Conversely, the features and functionality of various components can be combined into single components as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., a central processing unit (CPU), a FPGA (field programmable gate array), or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media (transitory or non-transitory, as appropriate) suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The memory may store various objects or data, including caches, classes, frameworks, applications, backup data, jobs, web pages, web page templates, database tables, repositories storing business and/or dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube), LCD (liquid crystal display), or plasma monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or GUI, may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN), a wide area network (WAN), e.g., the Internet, and a wireless local area network (WLAN).

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of sub-combinations.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be helpful. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations, alterations, and permutations of the described implementations are within the scope of the following claims as will be apparent to those skilled in the art. For example, the actions recited in the claims can be performed in a different order and still achieve desirable results.

Accordingly, the above description of example implementations does not define or constrain this disclosure. Other changes, substitutions, and alterations are also possible without departing from the spirit and scope of this disclosure.

What is claimed is:

1. An electric grid wire identification method comprising:
    obtaining a set of surface elements (surfels), wherein each surfel of the set of surfels represents a portion of a surface of an object in a geographic region and comprises surfel attributes including:
        a three-dimensional coordinate location of the surfel;
        a normal vector defining an orientation of the surface of the object at the three-dimensional coordinate location; and
        a shape defined by two or more axes;
    selecting, from the set of surfels, one or more surfels that each satisfies criteria for representing a portion of a surface of an electric grid wire, including determining, for each of the selected one or more surfels, that:
        a first axis of the two or more axes defining the shape of the surfel is greater than a second axis of the two or more axes; and
        an angle between the first axis and the ground surface is less than a threshold angle;
    generating a representation of the electric grid wire from the selected one or more surfels; and
    adding the representation of the electric grid wire to a virtual model of an electric grid.

2. The method of claim 1, wherein obtaining the set of surfels comprises:
    obtaining ranging data of the geographic region; and
    generating the set of surfels from the ranging data.

3. The method of claim 2, comprising selecting the geographic region, the selecting comprising:
    determining, based on overhead imagery of the geographic region, that the geographic region likely includes at least one electric grid wire.

4. The method of claim 2, comprising selecting the geographic region, the selecting comprising:
    determining, based on overhead imagery of the geographic region, that the geographic region likely includes at least one utility pole or power line.

5. The method of claim 2, wherein the ranging data comprises at least one of RADAR data or LIDAR data.

6. The method of claim 1, wherein selecting the one or more surfels that each represent a portion of a surface of an electric grid wire comprises:
    determining, using the set of surfels, a location of a utility pole or power line; and
    classifying attributes of surfels within a region surrounding the location of the utility pole.

7. The method of claim 1, wherein the surfel attributes comprise at least one of a location, a height above the ground surface, a texture, a color, a depth, or an orientation of the surfel.

8. The method of claim 1, wherein selecting the one or more surfels that each satisfies criteria for representing a portion of a surface of an electric grid wire comprises determining that the one or more surfels has a shape that satisfies shape criteria for representing an electric grid wire.

9. The method of claim 8, wherein determining that the one or more surfels has a shape that satisfies shape criteria for representing an electric grid wire comprises classifying the one or more surfels as having a tubular shape.

10. The method of claim 1, wherein:
selecting the one or more surfels that each satisfies criteria for representing a surface of an electric grid wire comprises determining that the one or more surfels has a height above the ground surface that satisfies height criteria for representing an electric grid wire, and
determining that the one or more surfels has a height above the ground surface that satisfies height criteria for representing an electric grid wire comprises classifying the one or more surfels as having a height greater than a minimum height above the ground surface.

11. The method of claim 1, wherein selecting the one or more surfels that each satisfies criteria for representing a surface of an electric grid wire comprises:
processing the set of surfels using a surfel classification model that is configured to identify surfels that represent surfaces of electric grid wires; and
obtaining, as output from the surfel classification model, data that identifies the selected one or more surfels.

12. The method of claim 1, wherein selecting the one or more surfels that each satisfies criteria for representing a surface of an electric grid wire comprises:
identifying a subset of surfels that each satisfies initial criteria for representing an electric grid wire, the initial criteria including at least one of shape criteria, orientation criteria, or height criteria; and
classifying the subset of surfels as being part of a cluster of surfels, wherein each surfel of the cluster of surfels satisfies the initial criteria.

13. The method of claim 12, wherein the cluster of surfels includes two or more surfels that are each located within a threshold distance to at least one other surfel of the cluster.

14. The method of claim 12, wherein selecting the one or more surfels that each satisfies criteria for representing a surface of an electric grid wire comprises:
determining, based on overhead imagery of the geographic region, an estimated end point of the electric grid wire; and
determining that a location of an end point of the cluster of surfels corresponds to the estimated end point of the electric grid wire.

15. The method of claim 12, wherein selecting the one or more surfels that each satisfies criteria for representing a surface of an electric grid wire comprises:
determining, using the set of surfels, an estimated location of a utility pole; and
determining that a location of an end point of the cluster of surfels corresponds to the estimated location of the utility pole.

16. The method of claim 1, wherein generating a representation of the electric grid wire from the selected one or more surfels comprises fitting a geometric curve to the selected one or more surfels, wherein the geometric curve represents a path of the electric grid wire.

17. The method of claim 1, wherein the representation of the electric grid wire comprises at least one of a geographic location, a size, a height, a classification, or a cardinal orientation of the electric grid wire.

18. The method of claim 1, wherein obtaining the set of surfels comprises obtaining the set of surfels from a database of surfels, wherein the database of surfels stores surfels generated from ranging data obtained from multiple geographic regions.

19. A system comprising one or more computers and one or more storage devices on which are stored instructions that are operable, when executed by the one or more computers, to cause the one or more computers to perform operations comprising:
obtaining a set of surface elements (surfels), wherein each surfel of the set of surfels represents a portion of a surface of an object in a geographic region and comprises surfel attributes including:
a three-dimensional coordinate location of the surfel;
a normal vector defining an orientation of the surface of the object at the three-dimensional coordinate location; and
a shape defined by two or more axes;
selecting, from the set of surfels, one or more surfels that each satisfies criteria for representing a portion of a surface of an electric grid wire, including determining, for each of the selected one or more surfels, that:
a first axis of the two or more axes defining the shape of the surfel is greater than a second axis of the two or more axes; and
an angle between the first axis and the ground surface is less than a threshold angle;
generating a representation of the electric grid wire from the selected one or more surfels; and
adding the representation of the electric grid wire to a virtual model of an electric grid.

20. A non-transitory computer-readable medium storing instructions that are operable, when executed by one or more computers, to cause the one or more computers to perform operations comprising:
obtaining a set of surface elements (surfels), wherein each surfel of the set of surfels represents a portion of a surface of an object in a geographic region and comprises surfel attributes including:
a three-dimensional coordinate location of the surfel;
a normal vector defining an orientation of the surface of the object at the three-dimensional coordinate location; and
a shape defined by two or more axes;
selecting, from the set of surfels, one or more surfels that each satisfies criteria for representing a portion of a surface of an electric grid wire, including determining, for each of the selected one or more surfels, that:
a first axis of the two or more axes defining the shape of the surfel is greater than a second axis of the two or more axes; and
an angle between the first axis and the ground surface is less than a threshold angle;
generating a representation of the electric grid wire from the selected one or more surfels; and
adding the representation of the electric grid wire to a virtual model of an electric grid.

* * * * *